United States Patent
Orii et al.

(10) Patent No.: US 7,416,632 B2
(45) Date of Patent: Aug. 26, 2008

(54) SUBSTRATE PROCESSING APPARATUS AND SUBSTRATE PROCESSING METHOD

(75) Inventors: Takehiko Orii, Nirasaki (JP); Masaru Amai, Tokyo-To (JP)

(73) Assignee: Tokyo Electron Limited, Tokyo-To (JP)

( * ) Notice: Subject to any disclaimer, the term of this patent is extended or adjusted under 35 U.S.C. 154(b) by 93 days.

(21) Appl. No.: 10/488,406

(22) PCT Filed: Aug. 28, 2002

(86) PCT No.: PCT/JP02/08685

§ 371 (c)(1),
(2), (4) Date: Mar. 3, 2004

(87) PCT Pub. No.: WO03/021657

PCT Pub. Date: Mar. 13, 2003

(65) Prior Publication Data

US 2004/0253833 A1    Dec. 16, 2004

(30) Foreign Application Priority Data

Sep. 3, 2001    (JP) .............................. 2001-265648

(51) Int. Cl.
C23F 1/00    (2006.01)
(52) U.S. Cl. .............................. 156/345.1; 156/345.54
(58) Field of Classification Search .............. 156/345.1, 156/345.54
See application file for complete search history.

(56) References Cited

U.S. PATENT DOCUMENTS

| 6,096,233 | A | 8/2000 | Taniyama et al. |
| 6,197,150 | B1 * | 3/2001 | Kwag et al. ............ 156/345.23 |
| 6,467,297 | B1 * | 10/2002 | Bollinger et al. .............. 62/404 |
| 7,225,819 | B2 * | 6/2007 | Jackson ....................... 134/200 |
| 2004/0253833 | A1 * | 12/2004 | Takehiko et al. ............. 438/778 |
| 2005/0160990 | A1 * | 7/2005 | Lubomirsky et al. ........ 118/728 |
| 2005/0263066 | A1 * | 12/2005 | Lubomirsky et al. ........ 118/500 |
| 2006/0160368 | A1 * | 7/2006 | Orii et al. .................... 438/745 |

FOREIGN PATENT DOCUMENTS

| JP | 06-163393 | 6/1994 |
| JP | 07-074140 | 3/1995 |

(Continued)

OTHER PUBLICATIONS

International Preliminary Examination Report (PCT/IPEA/409) (translated) issued for PCT/JP2002/008685.

(Continued)

*Primary Examiner*—Laura M. Schillinger
(74) *Attorney, Agent, or Firm*—Smith, Gambrell & Russell, LLP

(57) ABSTRACT

A substrate processing apparatus and a substrate processing method are provided wherein an oxide film which is thinner than the conventional films can be formed with uniform thickness when forming an oxide film on the front-side surface of a substrate.

A substrate processing apparatus (12) for processing a substrate (W) by feeding a processing liquid comprises: a temperature regulator (133) to regulate the temperature of said processing liquid; and a underplate temperature adjuster (115) to adjust the temperature of an underplate (77) which is placed in proximity to the backside surface of said substrate W.

6 Claims, 10 Drawing Sheets

FOREIGN PATENT DOCUMENTS

| | | |
|---|---|---|
| JP | 1996/130202 | 5/1996 |
| JP | 10-154701 | 6/1998 |
| JP | 11-307485 | 11/1999 |
| JP | 2000-195839 | 7/2000 |
| JP | 2001-085383 | 3/2001 |

OTHER PUBLICATIONS

Notification of Transmittal of Copies of Translation of the International Preliminary Examination Report (PCT/IB/338) issued for PCT/JP2002/008685.

* cited by examiner

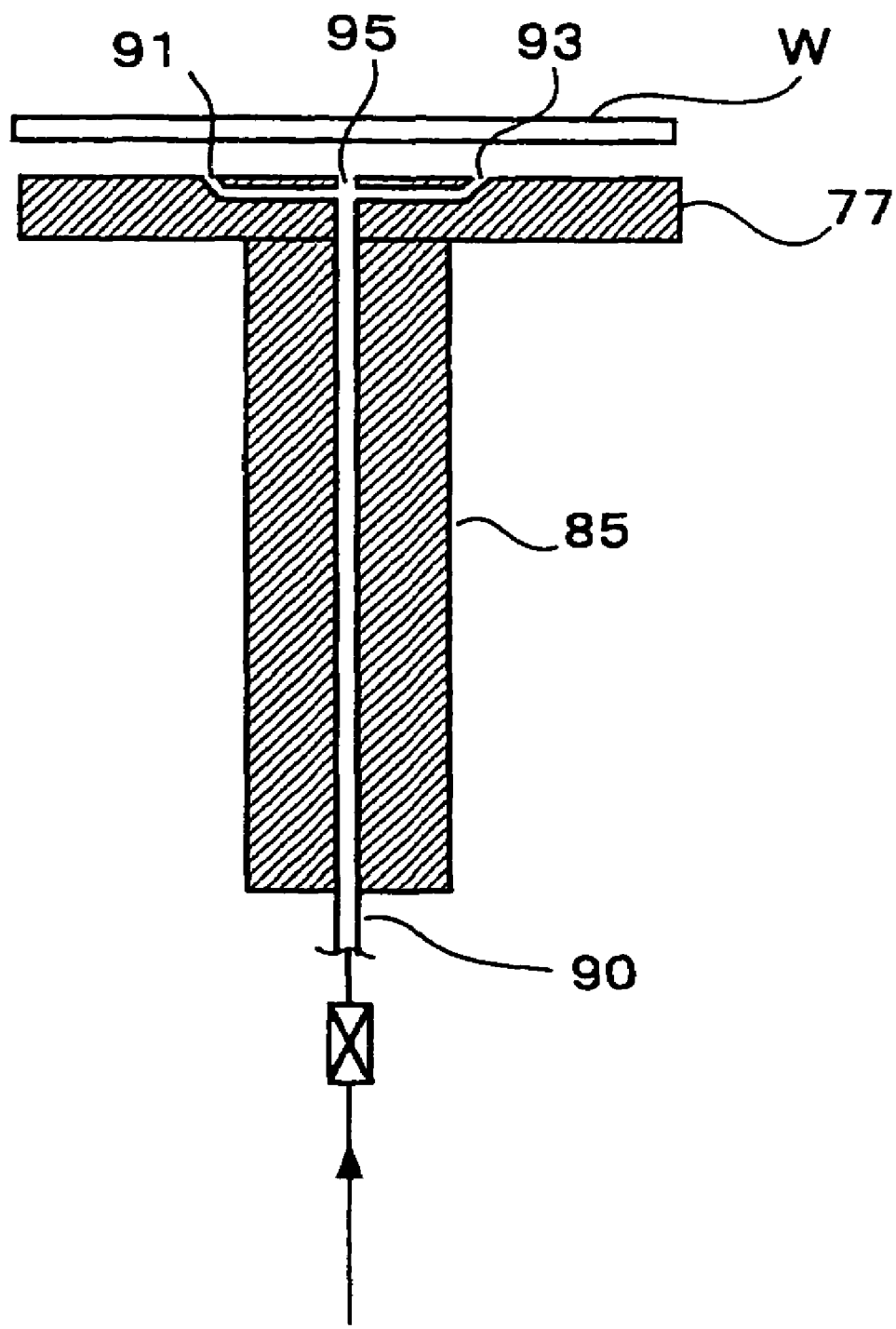
F I G. 5

SUBSTRATE PROCESSING APPARATUS AND SUBSTRATE PROCESSING METHOD

TECHNICAL FIELD

The present invention relates to a substrate processing apparatus and a substrate processing method for processing the surface of a substrate such as a semiconductor wafer for example.

BACKGROUND TECHNOLOGY

Generally, the manufacturing process of a semiconductor device includes a series of processing steps of: applying photoresist to a semiconductor wafer or the like as a substrate-to-be-processed (hereinafter referred to as a "wafer or the like"); printing an image of a circuit pattern on the photoresist; and then removing the photoresist from the wafer or the like.

In the above-mentioned processing, if an oxide film on the surface of a wafer or the like is removed by etching with a chemical liquid, dilute hydrofluoric acid (DHF) for example, the surface of the wafer or the like will become hydrophobic. Consequently, watermarks tend to be generated in a case that the wafer or the like proceeds to cleaning processing and drying processing without any other processing in between, which leads to a possible yield loss. Hydrophilization is then conducted by forming an oxide film on the surface of the wafer or the like so that the surface will have a hydrophilic character. A known method to form an oxide film is immersing a substrate in ozone water. A thinner oxide film is preferred to be formed as long as the oxide film has an enough thickness to prevent water mark generation.

However, the problem is that uniformity of the film thickness would be reduced by the conventional substrate processing method. A thin oxide film with a uniform thickness therefore could not be formed.

DISCLOSURE OF THE INVENTION

The purpose of the present invention is to provide a substrate processing apparatus and a substrate processing method, wherein a thinner oxide film than the conventional oxide films can be formed with uniform thickness when forming an oxide film on the front-side surface of a substrate.

In order to solve the above-mentioned problems, the present invention provides a substrate processing apparatus for processing a substrate by feeding a processing liquid, characterized by comprising:

a temperature regulator for regulating the temperature of said processing liquid; and a temperature adjusting mechanism for adjusting the temperature of an underplate which is placed in proximity to the backside surface of said substrate. In this case, processing of a substrate can be uniformly proceeded since the temperatures of a processing liquid and a substrate can be maintained at desired levels.

Furthermore, the present invention provides a substrate processing apparatus for processing a substrate by feeding a processing liquid, characterized by comprising:

a holder for holding the substrate in a horizontal position;

a processing-liquid feed device for feeding said processing liquid to the front-side surface of the substrate;

a temperature regulator for regulating the temperature of said processing liquid; and a temperature adjusting mechanism for adjusting the temperature of an underplate which is placed in proximity to the backside surface of said substrate.

Preferably, said underplate relatively moves to a position close to the backside surface of the substrate and to a position far from the backside surface of the substrate in a substrate processing apparatus according to the present invention.

Also, a substrate processing apparatus according to the present invention preferably comprises a top plate which is placed in proximity to the front-side surface of said substrate, said top plate relatively moving to a position close to the front-side surface of said substrate and to a position far from the front-side surface of said substrate. In this case, the temperatures of a processing liquid and the front-side surface of the substrate can be maintained at favorable levels since the atmospheric effects from above the substrate is inhibited. Furthermore, a substrate processing apparatus according to the present invention can comprise a gas feeder for feeding a temperature-controlled gas to the periphery of said substrate. In this case, the temperature around the substrate can be regulated.

Said processing liquid preferably is ozone water. Moreover, said temperature regulator cools the processing liquid and said temperature adjusting mechanism cools said underplate, preferably. In this case, an oxide film with uniform thickness can be formed for example on the front-side surface of the substrate.

The present invention provides a substrate processing method by feeding a processing liquid to the front-side surface of a substrate, the method characterized by:

adjusting the temperature of an underplate which is placed in proximity to the backside surface of the substrate to achieve a desired temperature of the substrate; and feeding a temperature-controlled processing liquid to the front-side surface of said substrate.

Furthermore, the present invention provides a substrate processing method by feeding a processing liquid to the front-side surface of the substrate, characterized by comprising the steps of:

loading the substrate into a substrate processing apparatus;

moving a temperature-controlled underplate to a position in proximity to the backside surface of the substrate to achieve a desired temperature of the substrate;

forming an oxide film by feeding a temperature-controlled processing liquid to the front-side surface of said substrate of the desired temperature;

moving said underplate far from said substrate; and unloading said substrate from inside the substrate processing apparatus.

The present invention further provides a substrate processing method by feeding a processing liquid to the front-side surface of a substrate, characterized by comprising the steps of:

loading the substrate into a substrate processing apparatus;

removing an oxide film from the substrate;

moving a temperature-controlled underplate to a position in proximity to the backside surface of the substrate to achieve a desired temperature of the substrate;

forming an oxide film by feeding a temperature-controlled processing liquid to the front-side surface of said substrate of the desired temperature;

moving said underplate far from said substrate; and unloading said substrate from inside the substrate processing apparatus.

A substrate processing method according to the present invention can also be characterized by forming a liquid film of the processing liquid on the front-side surface of said substrate. In addition, rotating said substrate is preferable in processing by feeding the processing liquid to the front-side surface of said substrate. In this case, pooling of the processing liquid is prevented, and thereby processing of the substrate can be uniformly proceeded.

In processing by feeding a temperature-controlled processing liquid to the front-side surface of said substrate, rotating said substrate and moving a processing-liquid feed nozzle from the circumferential portion to the central portion of said substrate while feeding a processing liquid is preferable according to a substrate processing method of the present invention. In this case, oxide film formation on the outer circumferential portion of a wafer W is slow since the outer circumferential portion rotates faster than the central portion, and oxide film formation on the central portion of a wafer W is fast since the central portion has no liquid velocity (drift velocity of a processing liquid). Consequently, uniform oxide films can be formed by moving the processing-liquid feed nozzle from the outer circumferential portion to the central portion of the substrate while feeding the processing liquid.

Furthermore, feeding the temperature-controlled processing liquid between said underplate and the backside surface of the substrate is preferable in processing of the front-side surface of said substrate. In this case, the backside surface of the substrate can be processed, for example. Also, in processing of the front-side surface of said substrate, a top plate can be moved to a position in proximity to the front-side surface of said substrate.

Furthermore, in a substrate processing method according to the present invention, separating the atmosphere around said substrate from the external atmosphere is preferable in processing of the front-side surface of said substrate. Moreover, in processing of the front-side surface of said substrate, a temperature-controlled gas can be fed to the periphery of said substrate to replace the atmosphere around said substrate with said temperature-controlled gas.

Said processing liquid is preferably ozone water. Also, cooling said underplate and feeding said processing liquid that is cooled is preferable.

BRIEF DESCRIPTION OF THE DRAWINGS

FIG. 5 is an explanatory diagram of a backside surface feed path and a backside surface discharge aperture.

BEST EMBODIMENTS FOR REALIZING THE INVENTION

Figure 1:
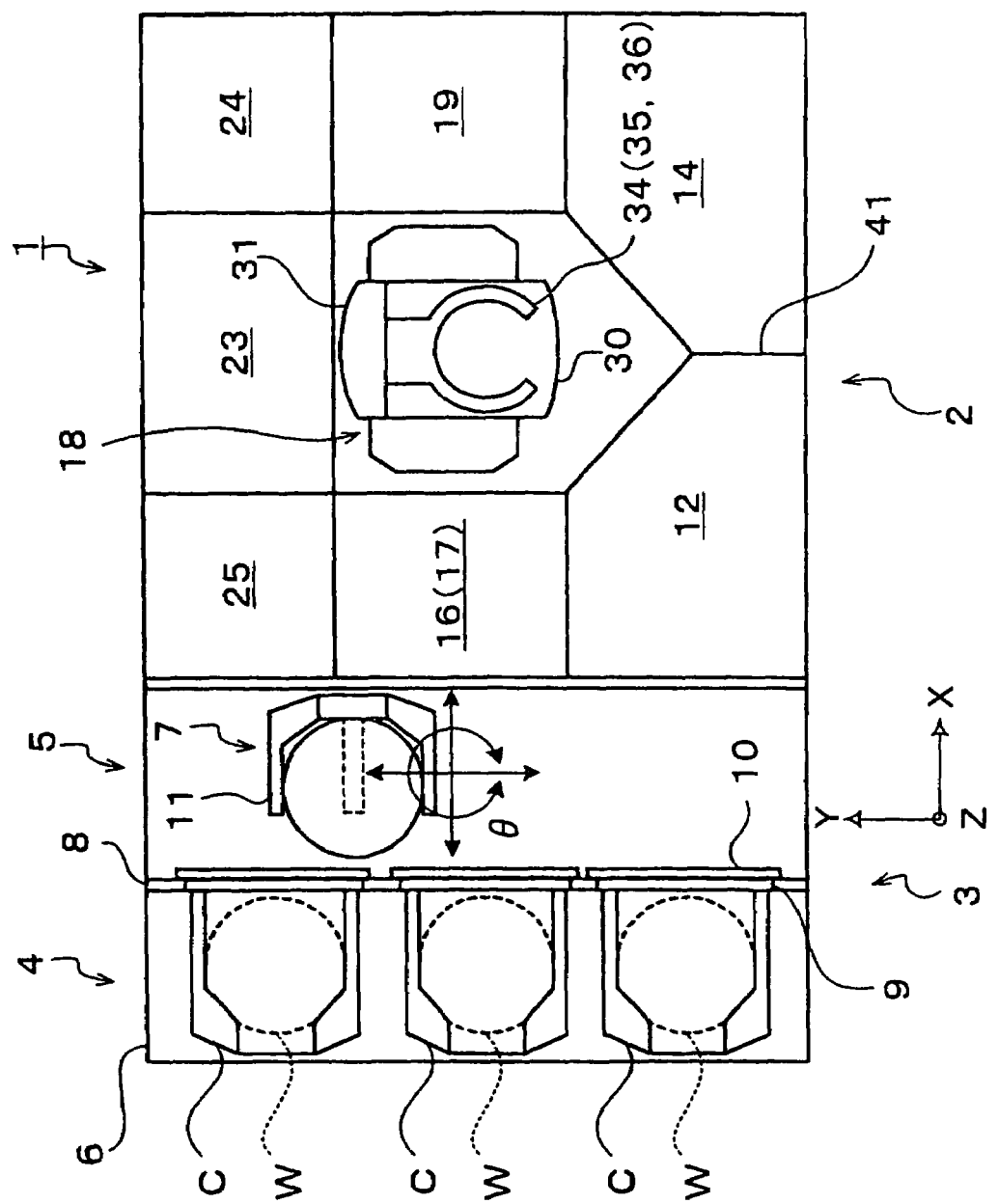
FIG. 1 is a plane view of a processing system.
Figure 2:
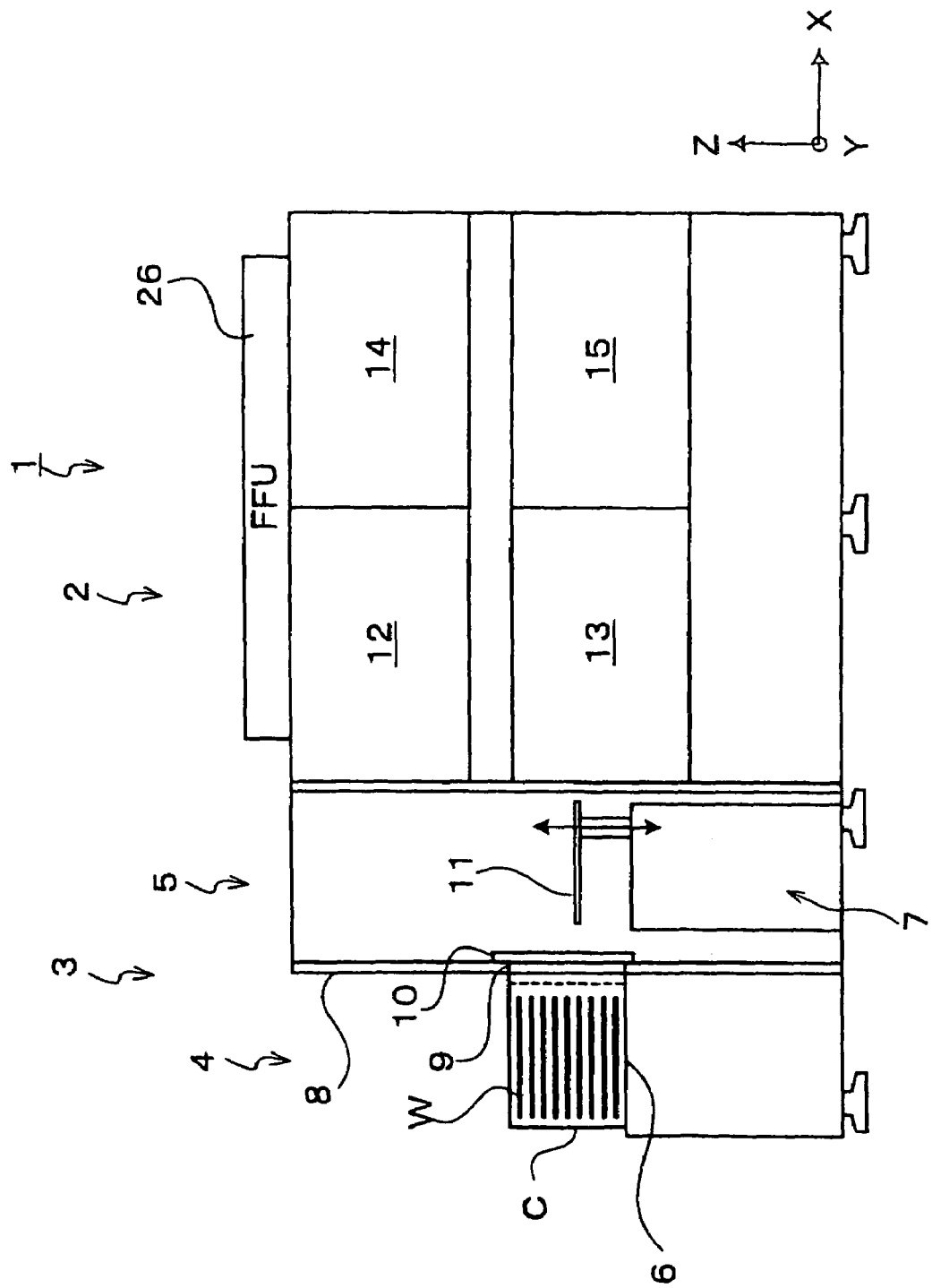
FIG. 2 is a side view of the processing system.

Preferred embodiments of the present invention will be hereinafter explained based on a substrate-processing unit, as a substrate processing apparatus, structured to conduct processing of the surface of a wafer as an example of a substrate, such as etching and hydrophilization. FIG. 1 is a plane view of the processing system 1 incorporating substrate-processing units 12, 13, 14 and 15 according to the present embodiment. FIG. 2 is a side view of the processing system 1. This processing system 1 comprises: a processing module 2 for thermal processing of a wafer W during and after substrate processing; and a load/unload module 3 to load or unload a wafer W into or from the processing module 2.

The load/unload module 3 comprises: an in/out port 4 providing a mount stand 6 to mount a holder (carrier C) which can accommodate a plurality of wafers, 25 wafers W for example, at regular intervals in a substantially horizontal position; and a wafer carrying module 5 equipped with a wafer carrying apparatus 7 to transfer wafers W between the carrier C mounted on the mount stand 6 and the processing module 2.

A wafer W is loaded or unloaded through one of the sides of the carrier C, and an openable/closable cover member is provided on the side of the carrier C. Furthermore, in order to hold wafers W at regular intervals, a shelf board is provided on the inner wall of the carrier C with 25 slots formed thereon to accommodate wafers W. Each slot accommodates one wafer W with its front-side surface (defined as the surface on which a semiconductor device is formed) up (defined as the upper direction when a wafer W is horizontally held).

On the mount stand 6 of the in/out port 4, three carriers, for example, can be mounted side by side at predetermined points in horizontal Y direction. The carriers C are mounted so that its side surface providing the cover member will face a separating wall 8 between the in/out port 4 and the wafer carrying module 5. Corresponding to the mounting location of the carrier C, a window portion 9 is formed on the separating wall 8, and on the side of the wafer carrying module 5 of the window portion 9, a window open/close mechanism 10 is provided which opens and closes the window portion 9 with a shutter or the like.

The window open/close mechanism 10 also can open and close the cover member provided on the carrier C, and so the window portion 9 and the cover member of the carrier C are concurrently opened and closed. By opening the window portion 9, the load/unload opening of the carrier C is open into the wafer carrying module 5, and the wafer carrying apparatus 7 disposed in the wafer carrying module 5 thus can have an access to the carrier C to carry a wafer W.

The wafer carrying apparatus 7 disposed in the wafer carrying module 5 is configured to be movable in both Y direction and Z direction and also rotatable within X-Y plane (in θ direction). Furthermore, the wafer carrying apparatus 7 has an unloading arm 11 to grasp a wafer W, and this unloading arm 11 is slidable in X direction. In this way, the wafer carrying apparatus 7 can access any slot formed at any height of any carrier C mounted on the mount stand 6 and also can carry a wafer W from the side of the in/out port 4 to the side of the processing section 2 by accessing upper and lower wafer transfer units 16 and 17 disposed in the processing module 2, and conversely from the side of the processing section 2 to the side of the in/out port 4.

The processing module 2 comprises: a main wafer-carrying apparatus 18; transfer units 16 and 17 to mount temporarily wafers W for transfer of the wafers W to/from the wafer carrying module 5; four substrate-processing units 12, 13, 14 and 15 according to the present embodiment; and a heating/cooling unit 19 consisting of three heating units for heating a processed wafer W and a cooling unit for cooling a heated wafer W. The main wafer-carrying apparatus 18 is disposed to have access to all the units including the wafer transfer units 16 and 17, the substrate-processing units 12, 13, 14 and 15 and the heating/cooling unit 19.

Furthermore, the processing module 2 is equipped with: an electric equipment unit 23 as a power source to operate the processing system 1 as a whole; a machine control unit 24 to perform operation control of devices of every kind disposed in the processing system 1 and the processing system 1 as a whole; and a chemical-liquid storage unit 25 to store specific cleaning liquid for feeding the substrate-processing units 12, 13, 14 and 15. The electric equipment unit 23 is connected with a primary power source, not shown. At the ceiling area of the processing module 2, a fan filter unit (FFU) 26 is disposed for the downflow of clean air into each unit and the main wafer-carrying apparatus 18.

By installing the electric equipment unit 23, the chemical-liquid storage unit 25 and the machine control unit 24 on the outer side of or outside the processing module 2, from the side (in Y direction) of the installation, maintenance of the wafer transfer unit 16, the main wafer-carrying apparatus 18 and the heating/cooling unit 19 can easily be done.

Both of the wafer transfer units 16 and 17 are provided to mount wafers W temporarily to transfer the wafers W to/from the wafer carrying module 5, and these two units are vertically piled up. In this way, the lower wafer transfer unit 17 can be used for mounting a wafer W which is carried from the side of the in/out port 4 to the side of the processing module 2 while the upper wafer transfer unit 16 can be used for mounting a wafer W which is carried from the side of the processing module 2 to the side of the in/out port 4, for instance.

The structure allows that the downflow from the fan filter unit (FFU) 26 partly flows out toward the wafer transfer units 16 and 17 and, through the space above the wafer transfer units 16 and 17, toward the wafer carrying module 5. In this way, particles and the like are prevented from entering the processing module 2 from the wafer carrying module 5, and thus cleanliness of the processing module 2 is maintained.

The main wafer-carrying apparatus 18 has: a tubular support 30 which is rotatable by the rotating force produced by a motor, not shown; and a wafer carrier 31 installed to be liftable in Z direction along the inner surface of the tubular support 30. The wafer carrier 31 is designed to be rotated by the rotation of the tubular support 30 in a unified manner and comprises three multistage carrying arms 34, 35 and 36 arranged in that each of the arms can independently move back and forth.

The heating/cooling unit 19 is equipped with a cooling unit to apply forced cooling to wafers W, and three heating units are piled up on the cooling unit to apply forced heating and natural cooling to wafers W. Meanwhile, the heating/cooling unit 19 can be provided in the space above the wafer transfer unit 16 instead. In this case, the location for the heating/cooling unit 19 shown in FIG. 1 can be utilized for another purpose.

The substrate-processing units 12, 13, 14 and 15 are disposed wherein two of the units lie above the other two as shown in FIG. 2. The substrate-processing units 12, 13 and the substrate-processing units 14, 15 are structurally symmetric with respect to a wall 41 which is a boundary therebetween, as shown in FIG. 1, but apart from the symmetricity, each of the substrate-processing units 12, 13, 14 and 15 has basically the same structure. In this connection, the mechanism of the substrate-processing unit 12 will be hereinafter explained in detail.

Figure 3:
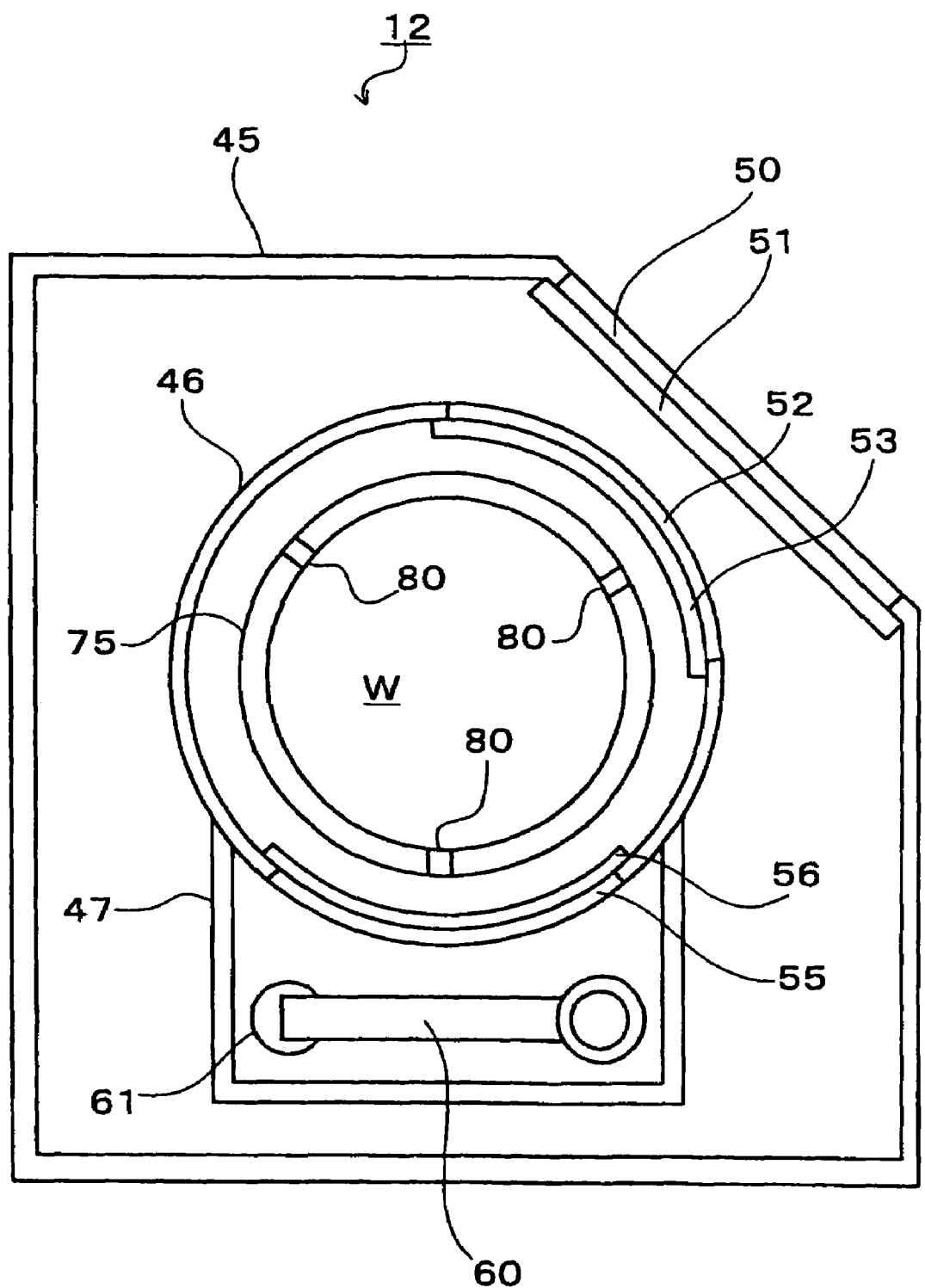
FIG. 3 is a plane view of a substrate-processing unit according to the embodiment of the present invention.

FIG. 3 is a plane view of the substrate-processing unit 12. The processing unit 12 comprises inside a unit chamber 45: an outer chamber 46 to separate the atmosphere inside the unit chamber 45 from the processing atmosphere surrounding a wafer W during processing of the wafer W; and a processing-liquid-feed nozzle 47, which nozzle feeds a wafer W housed within the outer chamber 46 with processing liquid or the like. In the unit chamber 45, an opening 50 is formed and a unit-chamber mechanical shutter 51 is provided to open/shut the opening 50 by an open/shut mechanism, not shown. The unit-chamber mechanical shutter 51 is opened when a wafer W is loaded/unloaded by the carrying arm 34 to/from the substrate-processing unit 12 through the opening 50. The unit-chamber mechanical shutter 51 is designed to open/shut the opening 50 from inside the unit chamber 45 so that no atmosphere inside the unit chamber 45 will leak out, even when positive pressure is generated inside the unit chamber 45.

In the outer chamber 46, an opening 52 is formed and an outer-chamber mechanical shutter 53 is provided to open/shut the opening 52 by a cylinder drive mechanism, not shown. This outer-chamber mechanical shutter 53 is opened, for example, when a wafer W is loaded/unloaded by the carrying arm 34 to/from the outer chamber 46 through the opening 52. The outer-chamber mechanical shutter 53 can also be designed to share the same open/shut mechanism of the unit-chamber mechanical shutter 51. Furthermore, in the outer chamber 46, an opening 55 is formed and a processing-liquid feed-nozzle-storage shutter 56 is provided to open/shut the opening 55 by a drive mechanism, not shown. To separate the processing-liquid feed-nozzle storage 47 from the atmosphere in the outer chamber 46, this processing-liquid feed-nozzle-storage shutter 56 is shut.

The outer-chamber mechanical shutter 53 is designed to open/shut the opening 52 from inside the outer chamber 46 so that no atmosphere inside the outer chamber 46 will leak out, even when positive pressure is generated inside the outer chamber 46. The processing-liquid feed-nozzle-storage shutter 56 is designed to open/shut the opening 55 from inside the outer chamber 46 so that no atmosphere inside the outer chamber 46 will leak out, even when positive pressure is generated inside the outer chamber 46. In this case, the atmosphere surrounding a wafer W inside the outer chamber 46 is separated from the outside of the outer chamber 46, thereby minimizing atmospheric effects from outside the outer chamber 46. A processing liquid and a wafer W can thus maintain proper temperature, for example.

Inside the processing-liquid feed-nozzle storage 47, a processing-liquid feed nozzle 60 is stored to spout out and feeds a processing liquid, such as a chemical liquid and pure water, or $N_2$ or the like to the surface of a wafer W. The processing-liquid feed nozzle 60 is housed within the outer chamber 46, with a minimum scannable range from the center to the rim of a wafer W held by a spin chuck 71, to be hereinafter described. The processing-liquid feed nozzle 60 stays in the processing-liquid feed-nozzle storage 47 when not in use in processing. Furthermore, the processing-liquid feed-nozzle storage 47 is provided with a processing-liquid-feed-nozzle cleaning device 61 which can clean the processing-liquid feed nozzle 60.

Figure 4:
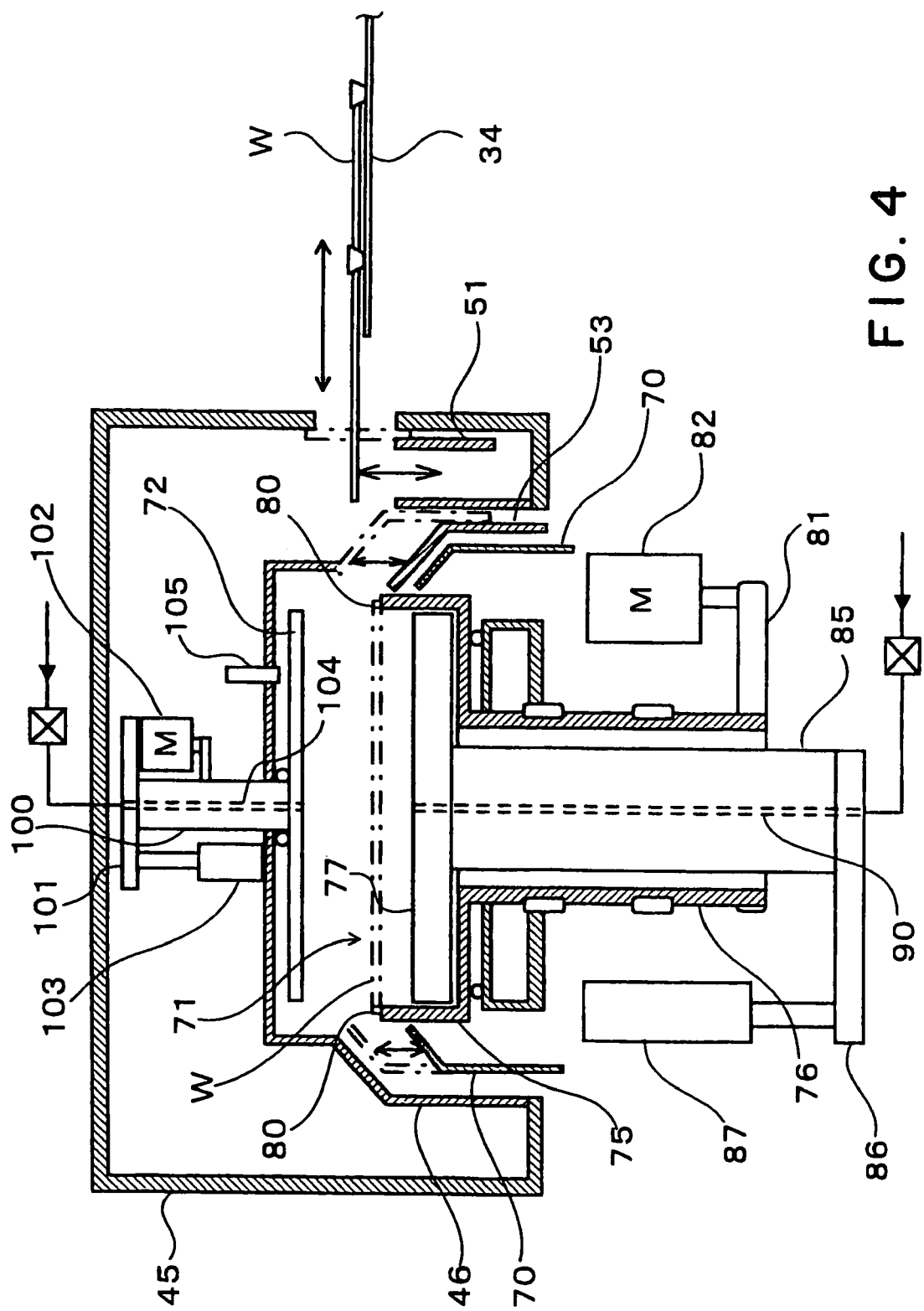
FIG. 4 is a vertical sectional view of the substrate-processing unit according to the embodiment of the present invention.

As shown in FIG. 4, the outer chamber 46 comprises inside: an inner cup 70 to house a wafer W; a spin chuck 71 to rotatably hold a wafer W, with the front-side surface of the wafer W up for example, inside the inner cup 70; and a top plate 72 in proximity to the front-side surface (upper surface) of a wafer W held by the spin chuck 71. At the top of the outer chamber 46, a gas feed nozzle 105 is provided to spout an attempered inert gas to the periphery of a wafer W.

The spin chuck 71 comprises: a chuck body 75 to hold a wafer W in a horizontal position; and a rotating cylindrical body 76 connected with the bottom of this chuck body 75. Inside the chuck body 75, an underplate 77 is placed which moves relatively close to or far from the backside surface (lower surface) of a wafer W held by the spin chuck 71.

Attached at a plurality of positions at the top of the chuck body 75 are: support pins, not shown, to support the rim parts of the backside surface of a wafer W; and holding members 80 to hold a wafer W at the rim. In the figure shown as an example, three holding members 80 can hold a wafer W at the rim. A belt 81 is wound around the outer circumferential surface of the rotating cylindrical body 76, and by turning around the belt 81 by a motor 82, the entire spin chuck 71 is rotated. Each of the holding members 80 is configured to hold the rim of a wafer W from the circumferential side, as shown in FIG. 3, making use of the centrifugal force generated by rotation of the spin chuck 71. When the spin chuck 71 is not in motion, the support pins support a wafer W at the backside surface, and when the spin chuck 71 is in a rotating motion, the holding members 80 hold a wafer W at the rim.

As shown in FIG. 4, the underplate 77 is connected with an underplate shaft 85 which is built thereunder piercing through the chuck body 75 and the rotating cylindrical body 76. The underplate shaft 85 is fastened to the upper surface of a horizontal plate 86, and this horizontal plate 86 can be vertically moved integrally with the underplate shaft 85 by a lift mechanism 87 equipped with an air cylinder etc. The underplate 77 thus can flexibly move up and down: as the configuration (retreating position) shown in FIG. 4 wherein the underplate 77 is moved down to the lower area inside the chuck body 75 to stay away from the backside surface of a wafer W supported by the spin chuck 71; and as the configuration (processing position) shown in FIG. 9 wherein the underplate 77 is moved up to the upper area inside the chuck body 75 to stay close to the backside surface of a wafer W supported by the spin chuck 71. The position of the underplate 77 also can flexibly move up and down to the processing position and the retreating position by connecting the rotating cylindrical body 76 with a lift mechanism, not shown, so that the entire spin chuck 71 can be moved vertically, while the underplate 77 is fixed at a predetermined height.

Figure 6:
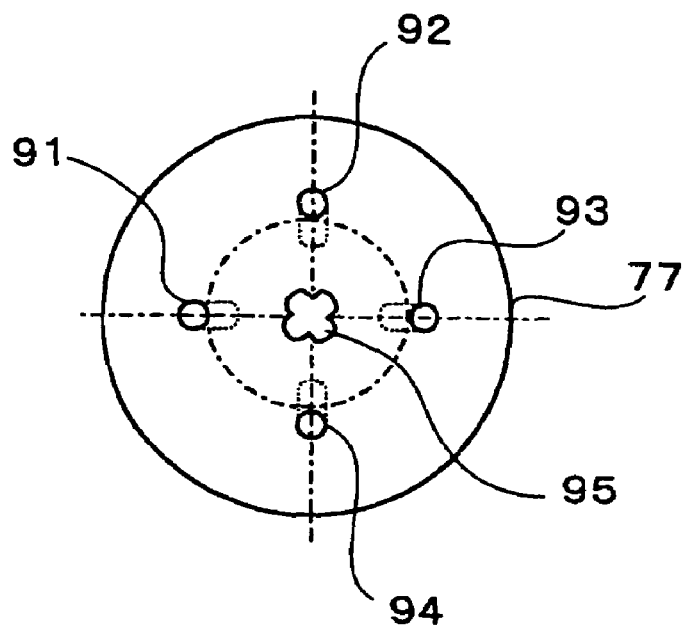
FIG. 6 is a plane view of an underplate.

As shown in FIG. 5, the underplate 77 is provided with an backside surface feed path 90 which pierces through the underplate shaft 85 to the underplate 77 so that a processing fluid, $N_2$, cooled ozone water or pure water for example, can be selectively fed between the backside surface of a wafer W and the underplate 77. As shown in FIG. 6, the underplate 77 is also provided with backside surface discharge apertures 91 to 95 which are formed at the center and 4 peripheral positions of the underplate 77 to discharge a processing fluid, ozone water, pure water or $N_2$ for example. The backside surface discharge apertures 91 to 94 at the peripheral positions of the underplate 77 are inclined in the direction of the circumference of a wafer W, and the backside surface discharge aperture 95 at the center is open upward toward the center of a wafer W.

Figure 7:
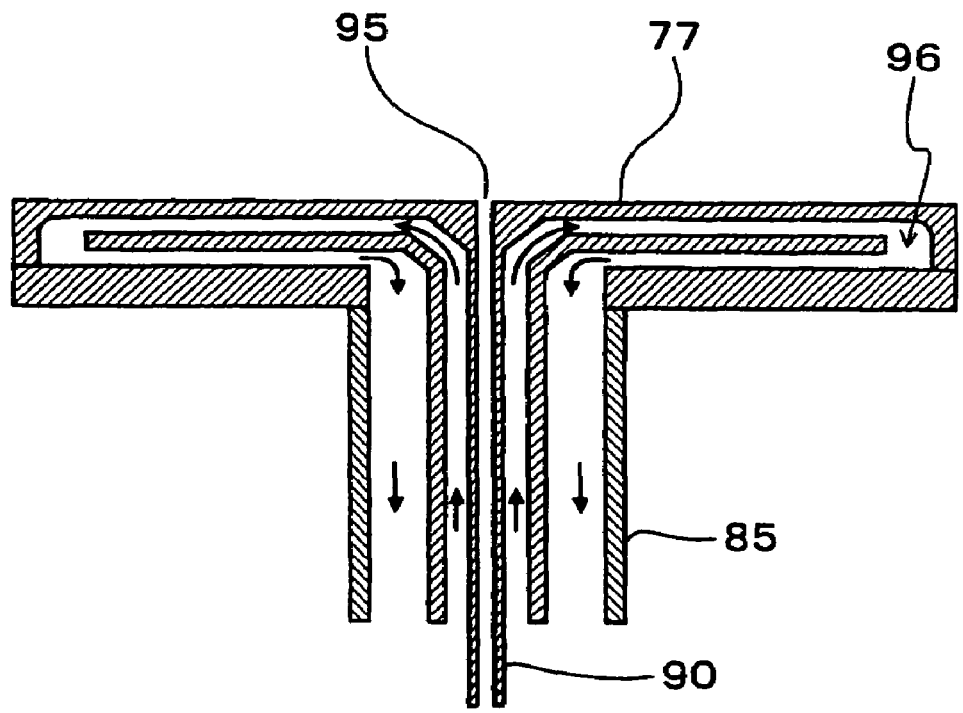
FIG. 7 is an explanatory diagram of an underplate temperature-control-water feed path.

As shown in FIG. 7, an underplate temperature-control-water feed path 96 is provided inside the underplate 77 to control the temperature of the underplate 77 to a predetermined level. Temperature control water which is cooled to a predetermined temperature is circulated through the underplate temperature-control-water feed path 96 via inlet and outlet openings in order to lower the temperature of the upper surface of the underplate 77 in proximity to the backside surface of a wafer W to e.g. around −20 to 5° C. In a case of processing a wafer W held by the spin chuck 71, the underplate 77 is moved relatively close to the backside surface of the wafer W and then temperature control water which is cooled to a predetermined temperature is circulated through the underplate temperature-control-water feed path 96 so that the temperature of the underplate 77 will be lowered. Since a wafer W and the underplate 77 are close to each other, a wafer W is cooled by the underplate 77. At this point, a wafer W is uniformly cooled and there is no partial temperature difference across a wafer. As a result, processing of a wafer W is proceeded uniformly, and thereby processing nonuniformity can be avoided. For instance, an oxide film with uniform thickness can be formed when hydrophilization of a wafer W is achieved by supplying ozone water to the front-side surface of the wafer W.

At the lower end of the top plate 72, a top-plate rotating shaft 72 is connected therewith and is rotated by a rotating-shaft motor 102 installed at a horizontal plate 101. The top-plate rotating shaft 72 is supported rotatably on the lower surface of the horizontal plate 101, and a rotating-shaft lift mechanism 103 which is equipped with an air cylinder etc. and fastened to the upper portion of the outer chamber 46 vertically moves this horizontal plate 101. By operating the rotating-shaft lift mechanism 103, the top plate 72 thus can flexibly move up and down relatively: as the configuration (processing position) shown in FIG. 9 wherein the top plate 72 is close to the front-side surface of a wafer W held by the spin chuck 71 and the front-side surface of the wafer W is being processed; and as the configuration (retreating position) shown in FIG. 4 wherein the top plate 72 stays away from the front-side surface of a wafer W. In this case, the proper temperatures of a processing liquid and the front-side surface of a wafer W can be maintained by moving down the top plate 72 to the processing position during the wafer processing for example so that the effects of the atmosphere of the upper area of the wafer W can be inhibited by the top plate 72. The top plate 72 is also provided with an upper-surface feed path 104 which pierces through the top-plate rotating shaft 100 to the top plate 72 so that a processing fluid such as ozone water can be selectively fed between the upper surface of a wafer W and the top plate 72.

Figure 9:
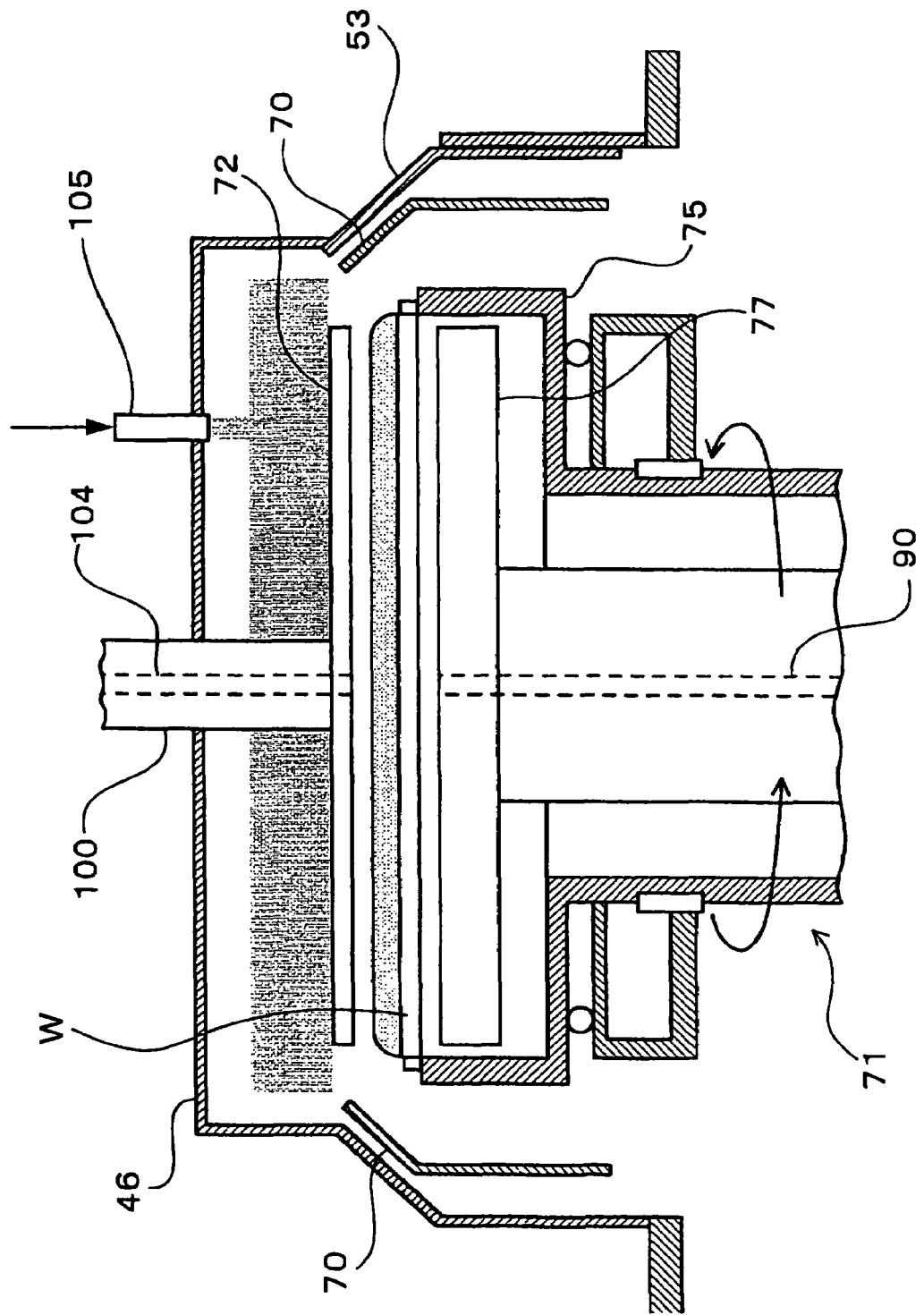
FIG. 9 is a diagrammatic sectional view showing an etching process.
Figure 10:
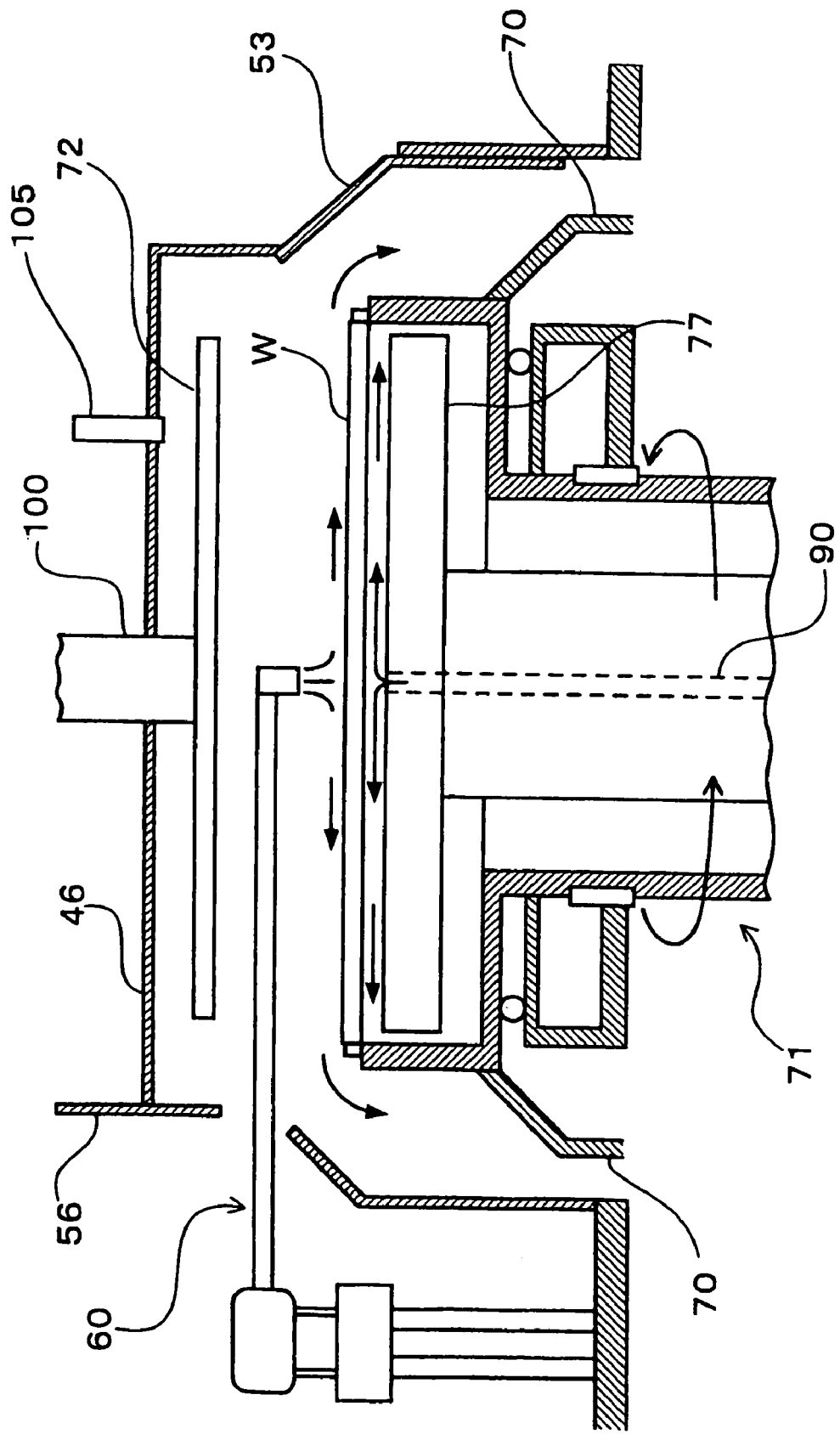
FIG. 10 is a diagrammatic sectional view showing a rinsing process.

The inner cup 70 can be moved up and down flexibly: to the configuration shown in FIG. 4 wherein the spin chuck 71 is projected above the upper end of the inner cup 70 to deliver or receive a wafer W; and to the configuration shown in FIG. 9 wherein the spin chuck 71 and a wafer W is encircled by the inner cup 70. In addition, when the inner cup 70 is moved down, the outer chamber 46 makes a configuration that prevents the scattering of a processing liquid supplied to the both sides of a wafer W. When the inner cup 70 is moved up, the upper portion of the inner cup 70 is in proximity to the inner wall of the outer chamber 46 to make a configuration that prevents the scattering of a processing liquid supplied to the both sides of a wafer W.

Figure 8:
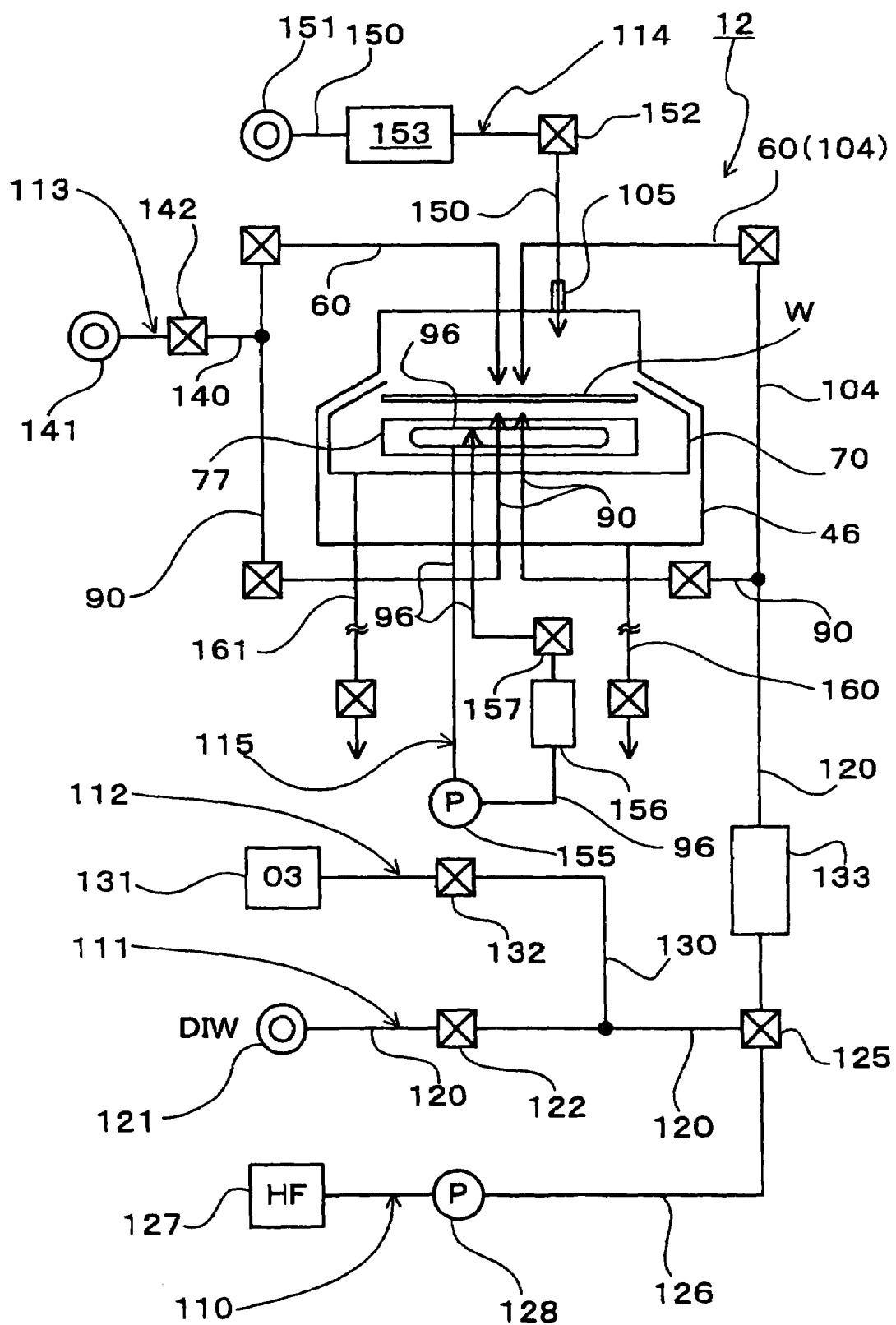
FIG. 8 is a pattern diagram of the substrate-processing unit.

FIG. 8 is a pattern diagram of the substrate-processing unit 12. The substrate-processing unit 12 comprises: a chemical-liquid feeder 110 for feeding a chemical liquid for oxide-film removal, e.g. dilute hydrofluoric acid (DHF), to a wafer W inside the outer chamber 46; a rinse-liquid feeder 111 for feeding a rinse liquid for rinsing, e.g. pure water (DIW), to a wafer W; and an ozone-water feeder 112 for feeding a processing liquid for hydrophilization, e.g. ozone water ($O_3$), to a wafer W. The substrate-processing unit 12 further comprises: a dry-gas feeder 113 for feeding $N_2$ for dry processing to a wafer W inside the outer chamber 46; a gas feeder 114 for feeding cooled gas between the interior of the outer chamber 46 and the top plate 72; and an underplate temperature adjuster 115 for controlling the temperature of the underplate 77 which is to be placed in proximity to the backside surface of a wafer W.

The processing-liquid feed nozzle 60, the upper-surface feed path 104 and the backside surface feed path 90 are connected with a pure water source 121 through a main feed pipe 120. Also, a valve 122 is inserted in the main feed pipe 120. The rinse-liquid feeder 111 is formed by these main feed pipe 120, pure water source 121, valve 122, processing-liquid feed nozzle 60, upper-surface feed path 104 and backside surface feed path 90.

A change-over on-off valve 125 is inserted downstream from the valve 122 and is connected with a chemical-liquid feed pipe 126. Through this chemical-liquid feed pipe 126, a chemical-liquid tank 127 for storing a chemical liquid, e.g. hydrofluoric acid (HF), is connected with the change-over on-off valve 125. In the chemical-liquid feed pipe 126, a pump 128 is inserted. The chemical-liquid feeder 110 is formed by these chemical-liquid feed pipe 126, chemical-liquid tank 127, pump 128, change-over on-off valve 125, main feed pipe 120, processing-liquid feed nozzle 60, upper-surface feed path 104 and backside surface feed path 90. In this case, pure water flowing inside the main feed pipe 120 and hydrofluoric acid (HF) supplied from the chemical-liquid tank 127 are mixed to make a chemical liquid (DHF) of a predetermined concentration to be supplied to a wafer W.

Furthermore, via an ozone-water feed pipe 130, an ozone-water generator 131 is connected between the valve 122 in the main feed pipe 120 and the change-over on-off valve 125. In the ozone-water feed pipe 130, a valve 132 is inserted. Also, in the main feed pipe 120, a temperature regulator 133 is inserted for temperature regulation of ozone water of a predetermined concentration to be supplied to a wafer W. The ozone-water feeder 112 is formed by these ozone-water feed pipe 130, ozone-water generator 131, valve 132, temperature regulator 133, main feed pipe 120, processing-liquid feed nozzle 60, upper-surface feed path 104 and backside surface feed path 90. In this case, pure water flowing inside the main feed pipe 120 and ozone water ($O_3$) generated by the ozone-water generator 131 are mixed to make ozone water of a predetermined concentration. The temperature regulator 133 then cools down the ozone water of a predetermined concentration to be supplied to a wafer W. Then, for hydrophilization to be achieved, the ozone water with a regulated temperature is supplied to the front-side surface of a wafer W from the upper-surface feed path 104 of the top plate 72 which is in a proximity to the front-side surface of the wafer W. Also, hydrophilization of the backside surface of a wafer W can be done by supplying ozone water with a regulated temperature between the underplate 77 and the backside surface of the wafer W from the backside surface feed path 90 of the underplate 77 which is in proximity to the backside surface of the wafer W.

Moreover, the processing-liquid feed nozzle 60 and the backside surface feed path 90 are connected with an $N_2$ source 141 via an $N_2$ feed path 140. In the $N_2$ feed path 140, a valve 142 is inserted. The dry-gas feeder 113 is formed by these $N_2$ feed path 140, $N_2$ source 141, valve 142, processing-liquid feed nozzle 60 and backside surface feed path 90.

Furthermore, the gas feed nozzle 105 is connected with a gas source 151 via a gas feed path 150. In the gas feed path 150, a valve 152 and a temperature regulator 153 which regulates the temperature of a gas flowing inside the gas feed path 150 are inserted. The gas feeder 114 is formed by these gas feed path 150, gas source 151, valve 152, temperature regulator 153 and gas feed nozzle 105. In the chemical (etching) processing of a wafer W, for example, the atmosphere of a chemical liquid can be discharged from the interior of the outer chamber 46 by a downflow produced by moving the top plate 72 down to the processing position to supply an inactive gas between the interior of the outer chamber 46 and the top plate 72. Furthermore, in the hydrophilization of a wafer W, for example, an inactive gas that has been cooled to a predetermined temperature by the temperature regulator 153 is supplied to the periphery of the wafer W so that the atmosphere surrounding the wafer W will be replaced with the cooled inactive gas. In addition, the atmosphere around a wafer W can be discharged by an outer-chamber discharge line 160 to be hereinafter described. In this case, a wafer W and the ozone water supplied to the wafer W can be effectively maintained at proper temperatures.

In the underplate temperature-control-water feed path 96 placed inside the underplate 77, a pump 155, a temperature controller 156 and a valve 157 are inserted. The underplate temperature adjuster 115 is formed by these underplate temperature-control-water feed path 96, pump 155 and temperature controller 156. In this case, temperature control water flowing through the underplate temperature-control-water feed path 96 is circulated by the pump 155 and temperature-controlled by the temperature controller 156 to be cooled to achieve a predetermined temperature. In this way, temperature control water inside the underplate 77 can uniformly lower the temperature of the upper surface of the underplate 77. In a case that a wafer W is hydrophilized by supplying ozone water to the both sides of the wafer W, for example, the underplate 77 is lifted up to the processing position in proximity to the backside surface of the wafer W and cold water is supplied to the underplate temperature-control-water feed path 96 so that the temperature of the entire upper surface of the underplate 77 will be uniformly lowered. As a result, the wafer W is controlled to have a uniform temperature. The temperature of temperature control water can also be raised to a predetermined temperature to be circulated through the underplate temperature-control-water feed path 96.

At this point, the preferred processing position can be described as the best position that enables the temperature controlling from the backside surface of a wafer W to achieve a uniform temperature of the wafer W at once. This is the most effective position for forming uniform oxide films.

The outer-chamber discharge line 160 is provided under the outer chamber 46. An inner-cup discharge line 161 is provided under the inner cup 70. The structure allows that the inner cup 70 is connected with the inner-cup discharge line 161 when the inner cup 70 comes up and the outer chamber 46 is connected with the outer-chamber discharge line 160 when the inner cup 70 comes down. Consequently, when the inner cup 70 comes up, the droplets inside the inner cup 70 are discharged through the inner-cup discharge line 161 and also the atmosphere inside the inner cup 70 and in the upper part in the outer chamber 46 is displaced by the inner-cup discharge line 161. When the inner cup 70 comes down and droplets are discharged into the outer chamber 46, the droplets are discharged through the outer-chamber discharge line 160 and also the atmosphere inside the outer chamber 46 is displaced by the outer-chamber discharge line 160.

In this connection, the other substrate-processing units 13, 14 and 15 comprised in the processing system 1 also have the same structure for achieving etching, hydrophilization, etc. on the front-side surface of a wafer W.

In this processing system 1, firstly, the carrier C which houses 25 uncleaned wafers W, for example, is mounted at the in/out port 4 by a delivery robot, not shown. Next, by the unloading arm 11, the wafers W are unloaded one by one from the carrier C mounted at the in/out port 4, and the wafers are transferred from the unloading arm 11 to the main wafer-carrying apparatus 18. Then, by the carrying arm 34 for example, each of the wafers W is loaded to the substrate-processing units 12, 13, 14 or 15 accordingly for etching and hydrophilization processed on the front-side surface of the wafers W. After completing the regular processing in this way, each of the wafers is unloaded by the main wafer-carrying apparatus 18 again from each of the substrate-processing units 12, 13, 14 or 15 accordingly, and transferred to the unloading arm 11, and then housed in the carrier C.

Explained below is about a substrate processing with the substrate-processing unit 12 as a representative model. As shown in FIG. 4, firstly the unit-chamber mechanical shutter 51 of the substrate-processing unit 12 is opened, and the outer-chamber mechanical shutter 53 of the outer chamber 46 is also opened. Then, the carrying arm 34 holding a wafer W proceeds into the apparatus. The inner cup comes down to relatively project the chuck body 75 upward. As shown in FIG. 4, the underplate 77 is located down at the retreating position inside the chuck body 75 in advance. The top plate 72 is located up at the retreating position in advance.

The main wafer-carrying apparatus 18 moves the carrying arm 34 horizontally to transfer a wafer W to the spin chuck 71, and the spin chuck 71 supports the wafer W with support pins, not shown, with the front-side surface of the wafer W, i.e. the surface that a semiconductor device is to be formed, facing upward. After transferring the wafer W to the spin chuck 71, the carrying arm 34 withdraws from inside the outer chamber 46 and the unit-chamber mechanical shutter 51, and after the withdrawal, the unit-chamber mechanical shutter 51 of the substrate-processing unit 12 and the outer-chamber mechanical shutter 53 of the outer chamber 46 are shut.

The inner cup 70 comes up and encircles the chuck body 75 and the wafer W thereafter. The underplate 77 then comes up to the processing position inside the chuck body 75. The underplate 77 moved to the processing position and the backside surface of the wafer W held by the spin chuck 71 form a gap therebetween.

The first process is etching to remove an oxide film from the front-side surface of a wafer W. The processing-liquid feed-nozzle-storage shutter 56 is opened, and the processing-liquid feed nozzle 60 turns around above the wafer W. The spin chuck 71 is rotated, and thereby the holding members 80 are centrifuged to hold the wafer W by the rim from the circumferential side so that the wafer W can be rotated. Then, the chemical-liquid feeder 110 feeds the front-side surface of the wafer W with a chemical liquid (DHF). Firstly, the valve 122 of the main feed pipe 120 is opened and the change-over on-off valve 125 is switched to open to the chemical liquid tank 127 side while the pump 128 is actuated. A chemical liquid (HF) and pure water are mixed at the change-over on-off valve 125, and the chemical liquid (DHF) is supplied to the processing-liquid feed nozzle 60 through the main feed pipe 120. The processing-liquid feed nozzle 60 then scans the range at least from the center to the rim of the rotating wafer W and fills the front-side surface of the wafer W with the chemical liquid to form a uniform liquid film of the chemical liquid.

After the chemical liquid film is formed on the front-side surface of the wafer W, the processing-liquid feed nozzle 60 moves into the processing-liquid feed-nozzle storage 47, and the processing-liquid feed-nozzle-storage shutter 56 shuts. The top plate 72 comes down to the position in proximity to the upper surface of the wafer W without making contact with the chemical liquid film formed on the front-side surface of the wafer W. As shown in FIG. 9, a gap is formed between the top plate 72 which has come down to the position in proximity to the front-side surface of the wafer W and the chemical liquid film formed on the front-side surface of the wafer W which is supported by the spin chuck 71. If, for instance, the shape of the chemical liquid film on the front-side surface of the wafer W is unstable, the shape of the chemical liquid film will be properly improved by feeding additional liquid from the upper-surface feed path 104 of the top plate 72. The top plate 72 also prevents evaporation of the chemical liquid from the chemical liquid film by covering the wafer W from above. Furthermore, the top plate 72 may make contact with the chemical liquid film. In this case, the chemical liquid film can be formed without fail between the top plate 72 and the upper surface of the wafer W.

While the chemical processing is proceeded, a downflow is formed by feeding a gas to the upper area of the top plate 72 from the gas feed nozzle 105 equipped at the top of the outer chamber 46. Since the space between the upper surface of the top plate 72 and the outer chamber 46 is filled with $N_2$, the atmosphere of the chemical liquid which is evaporated from the chemical liquid film and comes up from the circumference of the top plate 72 is blocked from escaping into the space above the top plate 72. This prevents the chemical liquid from remaining in the upper part inside the outer chamber 46 after the chemical processing.

After completing the chemical processing of the front-side surface of the wafer W, the top plate 72 moves up under rotation, thereby spinning off the chemical liquid staying on the top plate 72. The droplets are discharged into the inner-cup discharge line 161. After moving the top plate 72 to the retreating position, the spin chuck 71 rotates at 2000 rpm for 5 seconds for example, thereby spinning off the chemical liquid filling the wafer W to discharge into the inner cup 70. The droplets of the chemical liquid are discharged from the inner cup 70 through the inner-cup discharge line 161.

Subsequently, the inner cup 70 is moved down, the processing-liquid feed-nozzle-storage shutter 56 is opened, and the processing-liquid feed nozzle 60 turns around above the wafer W. The next process is to clean the wafer W by feeding a rinse liquid (DIW) thereto. The pump 128 is stopped, and the valve 122 of the main feed pipe 120 is switched to open only to the pure water source 121 side to feed the wafer W with pure water (DIW) from the main feed pipe 120 through the processing-liquid feed nozzle 60 and the backside surface feed path 90. The processing-liquid feed nozzle 60 feeds pure water (DIW) to the upper surface of the rotating wafer W while scanning the radius of the wafer W. The fed pure water (DIW) uniformly diffuses across the entire upper surface of the wafer W by feeding pure water (DIW) while the wafer W is rotating. On the other hand, the backside surface feed path 90 feeds pure water (DIW) between the underplate 77 and the backside surface of the wafer W. The fed pure water (DIW) uniformly diffuses across the entire backside surface of the wafer W by feeding pure water (DIW) through the gap. In this fashion, the underplate 77 also can be cleaned. In this way, the both sides of the wafer W are rinsed to clean off the chemical liquid. The pure water (DIW) is discharged into the outer chamber 46 and then discharged from the outer chamber 46 through the outer-chamber discharge line 160. After the pure water (DIW) feed is completed, the processing-liquid feed nozzle 60 moves into the processing-liquid feed-nozzle storage 47, and the processing-liquid feed-nozzle-storage shutter 56 shuts. Alternatively, the above-described rinsing processing with pure water (DIW) can be skipped.

Figure 11:
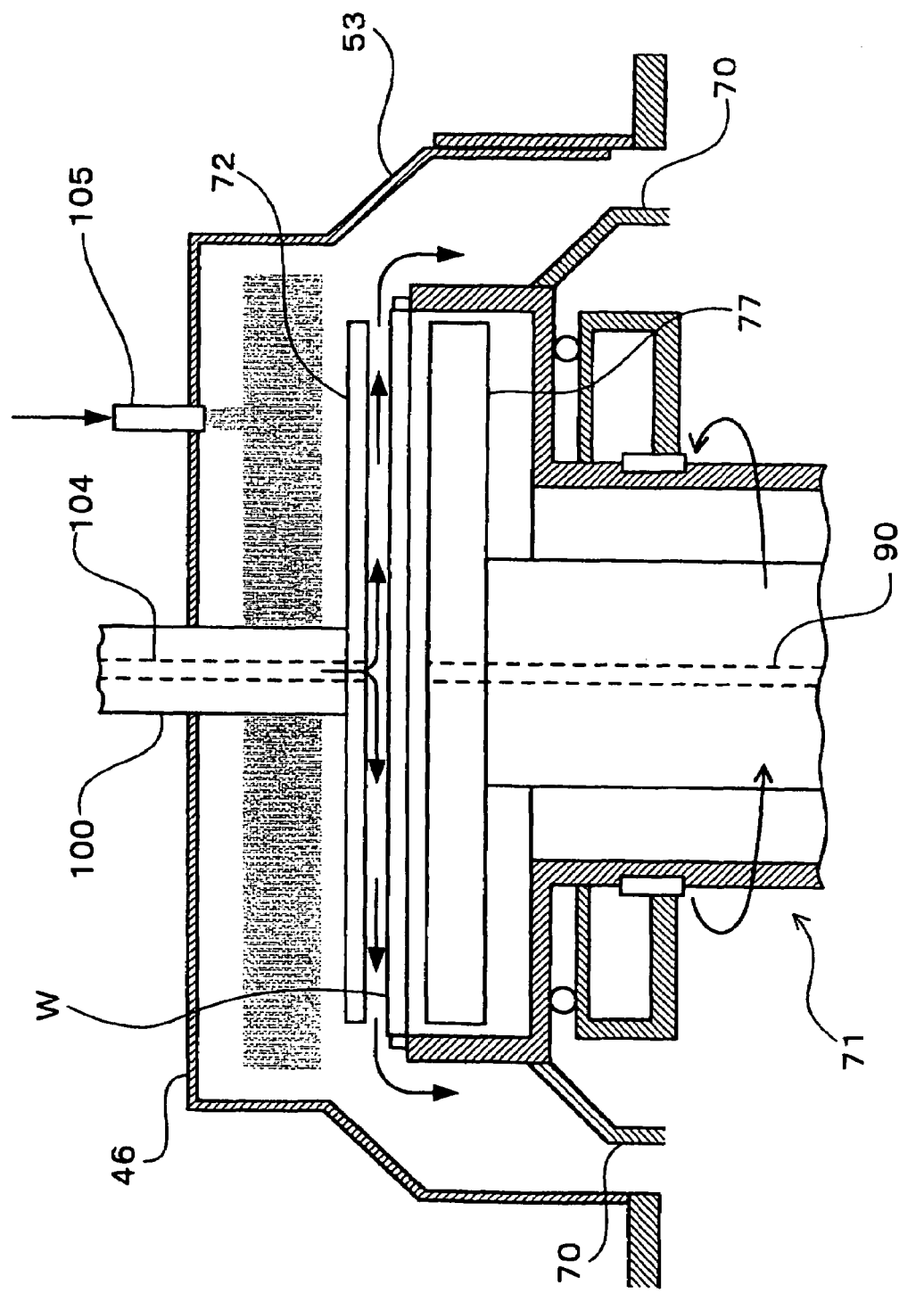
FIG. 11 is a diagrammatic sectional view showing drying process.

The process after the rinsing processing is to hydrophilize the front-side surface of the wafer W to form an oxide film thereon. The top plate 72 moves down to the processing position inside the chuck body 75, as shown in FIG. 11. A gap is formed between the top plate 72 moved down to the processing position and the upper surface (front-side surface) of the wafer W held by the spin chuck 71. The underplate 77 moves up to the processing position inside the chuck body 75. A gap is formed between the underplate 77 moved up to the processing position and the backside surface (backside surface) of the wafer W held by the spin chuck 71.

The temperature controller 156 is actuated for the underplate 77 to be cooled to a predetermined temperature through the underplate temperature-control-water feed path 96. The spin chuck 71 is rotated, and thereby the holding members 80 are centrifuged to hold the wafer W by the rim from the circumferential side so that the wafer W can be rotated. The valve 132 is opened, and ozone water ($O_3$) generated by the ozone-water generator 131 is flowed to the main feed pipe 120 through the ozone-water feed pipe 130. The ozone water then mixed with pure water. The ozone water of a predetermined concentration passes through the change-over on-off valve 125 and then is cooled by the temperature regulator 133. The ozone water thus prepared to have predetermined concentration and temperature is flowed from the main feed pipe 120 to the upper-surface feed path 104 to be fed to the front-side surface of the wafer W. As shown in FIG. 11, the ozone water is fed continuously in the proximity to the central portion of the wafer W and flows in the direction of the circumference of the wafer W by centrifugal force of the rotation of the wafer W. The ozone water flowed in the direction of the circumference of the wafer W is discharged into the outer chamber 46, as shown in FIG. 11, and then discharged from inside the outer chamber 46 through the outer-chamber discharge line 160.

During the hydrophilization, the entire wafer W can be maintained at an intended temperature since the underplate 77 covers the backside surface of the wafer W in proximity. Furthermore, the entire wafer W is uniformly cooled with no partial temperature difference thereacross since the underplate 77 is cooled by the underplate temperature-control-water feed path 96. By locating the top plate 72 in proximity to the front-side surface of the wafer W to cover the front-side surface of the wafer W, the temperatures of the front-side surface of the wafer W and the ozone water flowing between the top plate 72 and the front-side surface of the wafer W can be maintained. Also, by separating the atmosphere surrounding the wafer W from the outside of the outer chamber 46 by the outer chamber 46, atmospheric effects from inside the unit chamber 45 can be inhibited, and thus the temperatures of the wafer W, the ozone water and the processing atmosphere can be effectively maintained. Furthermore, during the hydrophilization, an inactive gas that is cooled to a predetermined temperature by the temperature regulator 153 is supplied around the wafer W in order to replace the atmosphere around the wafer W with the cooled inactive gas so that the low temperature of the wafer W and the ozone water supplied to the wafer W can be effectively maintained. By lowering the temperatures of the wafer W, the ozone water and the processing atmosphere in this way, an oxide film with thin and uniform thickness can be formed on the front-side surface of the wafer W. Moreover, by feeding ozone water continuously to the front-side surface of the wafer W and further by rotating the wafer W to prevent the ozone water from pooling thereon, the processing of the wafer can be proceeded uniformly.

After completing the hydrophilization of the front-side surface of the wafer W, the top plate 72 is moved up under rotation, thereby spinning off the ozone water staying on the top plate 72. The droplets are discharged into the outer chamber 46 and then discharged from the outer chamber 46 through the outer-chamber discharge line 160. After moving the top plate 72 to the retreating position, the spin chuck 71 is rotated to spin off the ozone water staying on the wafer W. The droplets are discharged into the outer chamber 46 and then discharged from the outer chamber 46 through the outer-chamber discharge line 160.

The subsequent process is to dry the wafer W by feeding $N_2$ thereto. The processing-liquid feed-nozzle-storage shutter 56 is opened and the processing-liquid feed nozzle 60 turns around again above the wafer W. The valve 142 of the dry-gas feeder 113 is opened to feed the wafer W with $N_2$ from the $N_2$ feed path 140 through the processing-liquid feed nozzle 60 and the backside surface feed path 90. The processing-liquid feed nozzle 60 feeds $N_2$ to the upper surface of the rotating wafer W while scanning the radius of the wafer W. On the other hand, the backside surface feed path 90 feeds $N_2$ between the underplate 77 and the backside surface of the wafer W. In this way, the both sides of the wafer W are dried and the upper surface of the underplate 77 can also be dried at the same time. At this point, there is no risk of water marks generated on the wafer W because the front-side surface of the wafer W is hydrophilized.

After completing the drying processing as described above, the processing-liquid feed nozzle 60 moves into the processing-liquid feed-nozzle storage 47, the processing-liquid feed-nozzle-storage shutter 56 shuts, and the underplate 77 comes down to the retreating position. Then, the wafer W is unloaded from inside the substrate-processing unit 12. The unit-chamber mechanical shutter 51 and the outer-chamber mechanical shutter 53 are opened, and the carrying arm 34 is proceeded into the apparatus by the main wafer-carrying apparatus 18 to support the backside surface of the wafer W. After that, the carrying arm 34 receives the wafer W detached from the support pins and withdraws. At this point, due to the location of the underplate 77 down at the retreating position, the underplate 77 and the wafer W supported by the spin chuck 71 form a wide enough gap therebetween, in the same manner as in loading, to allow the carrying arm 34 to afford receiving the wafer W from the spin chuck 71.

According to the substrate-processing unit 12 in this fashion, the temperature of a wafer W can be regulated to achieve a uniform distribution as a result of uniformly lowering the entire upper surface of the underplate 77. By inhibiting the effects of atmosphere outside the outer chamber 46, also inhibiting the effects of the atmosphere in the upper area of a wafer W, and replacing the atmosphere around a wafer W with a cooled inactive gas, the low temperatures of a processing liquid and the front-side surface of a substrate can be properly maintained. As a result, uniformity of oxide films can be improved.

While favorable embodiments of the present invention has been described herein by way of example, the present invention is not limited to the embodiments described herein. For instance, in the hydrophilization of a wafer W, ozone water can be fed not only from the upper-surface feed path 104 but also from the backside surface feed path 90 for example to process the both sides of a wafer W. Ozone water may be fed only from the backside surface feed path 90 to process only the backside surface of a wafer W. Furthermore, temperature-controlled pure water may be fed from the backside surface feed path 90 while feeding ozone water from the upper-surface feed path 104. In this case, the pure water intervenes in the narrow gap between the underplate 77 and the backside surface of a wafer W so that the wafer W can effectively be cooled.

Ozone water can be fed to the front-side surface of a wafer W by the processing-liquid feed nozzle 60 instead of feeding through the upper-surface feed path 104 of the top plate 72. For instance, the processing-liquid feed nozzle 60 turns around above the center of a wafer W and the wafer W rotates by the spin chuck 71, and thus ozone water is fed to the rotating wafer W from the processing-liquid feed nozzle 60. The ozone water is fed in the proximity of the central portion of the wafer W and flows in the direction of the circumference of the wafer W by centrifugal force of rotation of the wafer W. In this case, again, the liquid film of the ozone water and the wafer W is uniformly cooled since the underplate temperature-control-water feed path 96 cools the underplate 77 in proximity to the wafer W down to a predetermined temperature.

The processing-liquid feed nozzle 60 can be moved above a wafer W while feeding ozone water. For instance, the processing-liquid feed nozzle 60 can be moved from the center to the circumference of a wafer W or from the circumference to the center of a wafer W while feeding ozone water.

Oxide films are formed in a short time, and therefore, for forming an ozone water film across the entire front-side surface of the wafer W by the processing-liquid feed nozzle 60 in this case, the time period should be shorter enough than said time period for forming an oxide film, and the processing-liquid feed nozzle 60 is preferably set to move fast accordingly.

Also, since the outer circumferential portion of a wafer W rotates faster than the central portion does, oxide film formation thereon is generally slow. On the contrary, oxide film formation on the central portion of a wafer W is fast since the central portion has no liquid velocity (drift velocity of a processing liquid).

Given such factor, uniform oxide films can be thus formed by moving the processing-liquid feed nozzle 60 from the circumferential portion to the central portion of a wafer W while feeding ozone water.

Furthermore, in a case that the processing-liquid feed nozzle 60 is moved from the central portion to the circumferential portion of a wafer W while feeding ozone water, uniform oxide films can be formed by controlling the movement velocity of the processing-liquid feed nozzle 60 to achieve relatively fast movement velocity of the processing-liquid feed nozzle 60 at the central portion of a wafer W and slow movement velocity at the circumferential portion of the wafer W.

The oxide film formation time changes as the ozone water temperature changes.

However, uniform oxide films can still be formed by monitoring the temperature of the ozone water, the temperature of the underplate 77 or the temperature control water of the underplate 77, or the temperature of a wafer W itself or the peripheral part of the wafer W, so that the movement velocity of the processing-liquid feed nozzle 60 is controlled in response to the monitored temperature.

Also, instead of flowing ozone water from the proximity of the central portion of a wafer W to the outer circumference direction by continuous feeding, a liquid film of ozone water can be formed. In this case, ozone water consumption can be saved. On the one hand, for instance, a liquid film of ozone water is uniformly formed on the front-side surface of a wafer W by filling the front-side surface of the wafer W with cooled ozone water by the processing-liquid feed nozzle 60. On the other hand, a liquid film of ozone water is formed on the backside surface of the wafer W by gently exude cooled ozone water from the backside surface feed path 90 so that the ozone water will be depressed and diffuse between the underplate 77 and the backside surface of the wafer, while the wafer W is rotated at a relatively slow rotation velocity. After forming liquid films of ozone water on the both sides of the wafer W, the top plate 72 is moved down to the processing position. After a predetermined time, an oxide film with desired thickness is formed on the front-side surface of the wafer W. In this case, again, the liquid film of ozone water and the wafer W is uniformly cooled because the underplate temperature-control-water feed path 96 cools the underplate 77 in proximity to the wafer W to a predetermined temperature.

The processing liquid for hydrophilizing a substrate is not limited to ozone water but includes any processing liquid that can oxidize the front-side surface of a substrate. Moreover, the present invention is not limited to conduct hydrophilization but to also conduct other kinds of processing on a substrate using various processing liquids other than hydrophilization. Furthermore, the substrate is not limited to semiconductor wafers but includes other substrates which need oxide films to be formed thereon.

According to the present invention, the temperature of a substrate can be adjusted to be a uniform temperature. During substrate processing, the processing liquid and the substrate can maintain proper temperatures. Uniformity of oxide films thus can be improved.

What is claimed is:

1. A substrate processing apparatus for processing a substrate by feeding a processing liquid, said apparatus comprising:
   a temperature regulator for regulating the temperature of said processing liquid; and
   a temperature adjusting mechanism for adjusting the temperature of an underplate which is placed in proximity to the backside surface of said substrate; and
   a processing-liquid feeding mechanism for feeding a temperature-controlled processing liquid to a space between said underplate and the backside surface of said substrate from at least one discharge apertures formed on a surface of the underplate below the substrate.

2. The substrate processing apparatus according to claim 1, wherein said underplate relatively moves to a position close to the backside surface of the substrate and to a position far from the backside surface of the substrate.

3. The substrate processing apparatus according to claim 1, further comprising a top plate which is placed in proximity to the front-side surface of said substrate, said top plate relatively moving to a position close to the front-side surface of said substrate and to a position far from the front-side surface of said substrate.

4. The substrate processing apparatus according to claim 1, further comprising a gas feeder for feeding a temperature-controlled gas to the periphery of said substrate.

5. The substrate processing apparatus according to claim 1, wherein said processing liquid is ozone water.

6. The substrate processing apparatus according to claim 1, wherein
   said temperature regulator cools the processing liquid;
   said temperature adjusting mechanism cools said underplate; and
   a processing liquid fed between said underplate and the backside of said substrate is cooled.

* * * * *